(12) United States Patent
Fathauer

(10) Patent No.: US 6,387,781 B1
(45) Date of Patent: May 14, 2002

(54) METHOD OF FORMING THREE-DIMENSIONAL SEMICONDUCTORS STRUCTURES

(75) Inventor: Robert W. Fathauer, Sunland, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 07/524,959

(22) Filed: May 18, 1990

(51) Int. Cl.$^7$ ............................................... H01L 21/36
(52) U.S. Cl. ......................... 438/504; 438/41; 438/607
(58) Field of Search ........................ 438/41, 44, 504, 438/509, 607, 677, 680, 683

(56) References Cited

U.S. PATENT DOCUMENTS

| | | | | |
|---|---|---|---|---|
| 3,992,233 A | | 11/1976 | Farrow ......................... | 438/20 |
| 4,099,305 A | | 7/1978 | Cho et al. .................... | 438/504 |
| 4,147,573 A | | 4/1979 | Morimoto .................... | 117/97 |
| 4,171,234 A | | 10/1979 | Nagata et al. ............... | 438/504 |
| 4,411,728 A | | 10/1983 | Sakamoto .................... | 117/105 |
| 4,501,769 A | * | 2/1985 | Hieber et al. ............... | 437/200 |
| 4,554,030 A | | 11/1985 | Haisma et al. ............... | 117/9 |
| 4,662,060 A | | 5/1987 | Aina et al. ................... | 438/185 |
| 4,707,197 A | * | 11/1987 | Hensel et al. ............... | 437/200 |
| 4,758,534 A | * | 7/1988 | Derkits, Jr. et al. ......... | 437/110 |
| 4,871,691 A | * | 10/1989 | Torres et al. ................ | 437/200 |
| 4,901,121 A | * | 2/1990 | Gibson et al. .............. | 437/110 |
| 4,957,777 A | * | 9/1990 | Ilderem et al. ............. | 437/225 |

OTHER PUBLICATIONS

Badoz et al., "Selective silicon Epitaxial Growth on a Submicrometer Tungsten Disilicide", J. Electron. Mater., 19(10), pp. 1123–1127, 1990.*
Fathauer et al., "Nucleation and growth of Chromium Disilicide on silicon (111)", Mater. Res. soc. symp. Proc. vol. 116, pp. 453–458, 1988.*
Ishizaka et al., "Formation of Embedded Monocrystalline NiSi2 Grid Layers in Silicon by MBE", JPNS J. of Applied Physics, vol. 23, No. 7, pp. 1449–1601, Jul. 1984.*
Bozler et al., "Fabrication of the Permeable Base Transistor", IEEE Trans Electron Dev., vol. ED–27, No. 6, pp. 1128–1141, 1990.*

* cited by examiner

Primary Examiner—Charles Bowers
Assistant Examiner—Keith Christianson
(74) Attorney, Agent, or Firm—John H. Kusmiss

(57) ABSTRACT

Silicon and metal are coevaporated onto a silicon substrate in a molecular beam epitaxy system with a larger than stoichiometric amount of silicon so as to epitaxially grow columns of metal silicide embedded in a matrix of single crystal, epitaxially grown silicon. Higher substrate temperatures and lower deposition rates yield larger columns that are farther apart while more silicon produces smaller columns. Column shapes and locations are selected by seeding the substrate with metal silicide starting regions. A variety of 3-dimensional, exemplary electronic devices are disclosed.

12 Claims, 2 Drawing Sheets

METHOD OF FORMING THREE-DIMENSIONAL SEMICONDUCTORS STRUCTURES

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

The present invention relates to the fabrication of electronic devices and integrated circuit devices by the deposition of circuit elements on a substrate such as silicon using the techniques of molecular beam epitaxy. More specifically, a new process is disclosed that allows the formation of circuit elements in three dimensions, rather than as planar layers, thus providing an entirely new class of structures.

BACKGROUND OF THE INVENTION

The prior art recognizes molecular beam epitaxy (MBE) as the best process for depositing very thin layers of metal and semiconductor compounds onto substrates such as silicon. The MBE process uses an ultra-high vacuum chamber containing the substrate and one or more evaporation crucibles. The material to be deposited is heated in a crucible until the material vaporizes. Molecules of the vaporized material travel unimpeded through the vacuum in straight lines to the surface of the substrate. Because of their straight flight paths, the molecules are easily collimated into a controllable beam, by suitable apertures, so as to impinge on the substrate at a selected rate and from a selected direction. Shutters may be interposed in the beam to block the beam for periods of time. Varying the heating of the crucible controls the rate of free molecule production.

The substrate is usually heated so that the arriving molecules remain mobile on the surface for a short time. Thus, each molecule has time to locate a preferred site upon which to attach so that a regular crystal growth is facilitated. In this way, very thin layers of single crystal or monocrystalline material may be deposited that are on the order of nanometers thick.

To enhance single crystal growth, the deposited layer should have a natural crystal structure similar in shape and size characteristics to the crystal structure of the substrate so that epitaxial growth takes place. In other words, the regular crystal lattice of the substrate provides a template upon which the arriving atoms of deposited material are organized into a similar, regular, single crystal structure.

Any substrate adaptable to the above outlined principles could profit from the process of this invention. For example, substrates may comprise silicon, germanium, or compound semiconductors such as gallium arsenide, indium arsenide and indium antimonide. However, the discussion herein is oriented to the most common and best understood substrate material which is silicon.

The deposited conductor is usually selected to be chemically compatible with the chosen substrate and may be a metal and semiconductor compound or even a combination of two semiconductors such as silicon and germanium. A conductor for an indium antimonide substrate, for example, might be a compound of nickel and antimony. Once again, however, the discussion herein is focused on metal silicide deposits which are also well known and characterized with respect to their structure and properties.

Metal silicides, combinations of metals such as cobalt, platinum, chromium, nickel, tantalum, or iridium with silicon, are good choices for the deposited layer on silicon substrates since they are chemically compatible with the silicon substrate. To deposit metal silicides, the metal and the silicon are coevaporated in separate crucibles at rates so as to impinge on the silicon substrate in correct stoichiometric ratios to form the desired single crystal compound in a thin layer. For example, cobalt disilicide ($CoSi_2$) is a well studied metal silicide conductor that is produced by MBE methods in which cobalt and silicon are coevaporated in a ratio of one cobalt atom for every two silicon atoms.

Prior art MBE methods control the thickness of the deposited layer by the length and rate of deposition. This affects only the dimension perpendicular to the substrate. Lateral dimensions, those parallel to the substrate surface, are controlled by lithographic techniques and limited to relatively large dimensions. The present invention, by contrast, provides a means whereby both vertical and lateral dimensions are controllable so as to permit the creation of a whole new class of three-dimensional MBE deposited devices not heretofore possible.

STATEMENT OF THE PRIOR ART

U.S. Pat. No. 4,171,234 to Negata et al. discloses a process that avoids the use of masks during MBE by forming irregular shapes in the substrate. These shapes are used to shadow an incident molecular beam, at various angles, so as to modify the characteristics of the deposited crystalline layer. The kinds of epitaxial structures that can be created this way are obviously quite limited. Beyond the height of the substrate mesas the deposited layer would revert to a planar layer of no distinction. The instant invention, however can begin with an ordinary planar substrate and develop a wide variety of three dimensional structures of almost any desired configuration.

U.S. Pat. No. 4,099,305 to Cho et al. discloses a process similar to Negata above and subject to the same limitations.

SUMMARY OF THE INVENTION

The present invention contemplates a new MBE type process that produces column like structures that grow epitaxially from the substrate surface in a direction generally perpendicular thereto. The height, width, shape, and spacing of the columns are all selectable by modification of the processing parameters rather than by masking. A large variety of desired three dimensional shapes may be generated to make available an entire new set of electronic devices. Some of these new devices are described, by way of example, in order to emphasize the potential of this inventive technique.

Briefly, the new MBE process involves coevaporating metal and silicon in ratios well removed from stoichiometric with a large excess of silicon. Given the correct growth environment, vertical columns of single crystal metal silicide epitaxially form upward from the silicon substrate surface. The columns are embedded in a surrounding matrix of single crystal silicon. It has been determined that the spacing, thickness, and height of the columns may be chosen by varying the process parameters. In addition, the location and shape of the columns may be selected by seeding the substrate in the places where columns are desired.

The principles of the invention are applicable to many substrate materials such as silicon, germanium, gallium arsenide, indium arsenide, or indium antimonide. For the selected substrate, a chemically compatible conductor is chosen comprising a combination deposit of metal and semiconductor or a combination deposit of two semiconductors, once again using an excess quantity of the semiconductor that forms a matrix on the substrate. Thus, although the conductive structures are described as metal compounds in this specification, for ease of explanation, the word metal is intended to include electrically conductive materials in general, especially semiconductors.

These and many other features and attendant advantages of the invention will become apparent as the invention becomes better understood by reference to the following detailed description when considered in conjunction with the accompanying drawings.

DETAILED DESCRIPTION OF THE INVENTION

Figure 1:
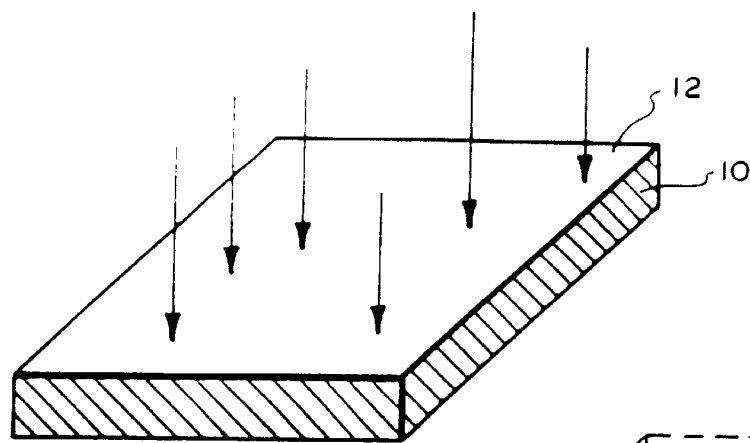
FIGS. 1 and 2 illustrate the basic steps in the development of vertical columns of conductive material on a substrate.
Figure 2:
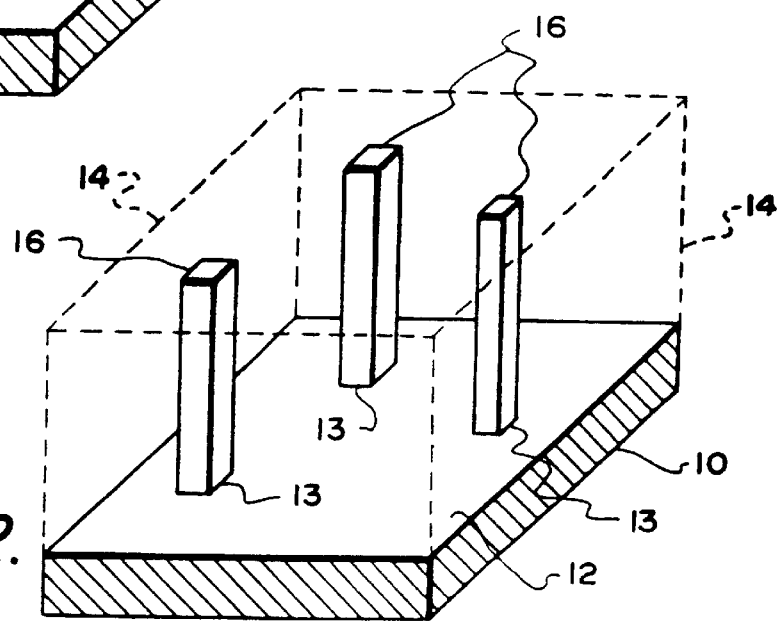

FIGS. 1 and 2 demonstrate the basic process of the invention. FIG. 1 shows a small section of a silicon substrate 10 which is processed in an ultra-high vacuum MBE system chamber. Substrate 10 is cleaned by standard techniques well known to the art so as to produce an atomically clean surface 12. Substrate 10 is heated to a temperature such that arriving atoms of the deposition material have an interval of movement on surface 12 sufficient to locate the desired bonding sites. For the metal silicides, temperatures in the range of 640 to 800 degrees Centigrade have been successfully used. Cobalt disilicides will be utilized as the deposited material for purposes of illustrating and describing the invention. Of course, the subject of this invention is applicable to metal silicides generally. Also all other combinations of metal with semiconductor, or semiconductor with semiconductor, like silicon with germanium, are suitable for deposition as well depending on the selected substrate material.

For cobalt disilicide, cobalt and silicon are coevaporated in the MBE chamber and allowed to shower onto surface 12 as suggested by arrows in FIG. 1. The ratio of cobalt to silicon is intentionally made non-stoichiometric with an excess of silicon. For example, ten silicon atoms may be directed to surface 12 for every cobalt atom. This silicon rich ratio produces an unexpected and unique effect as shown in FIG. 2.

In FIG. 2, the cobalt atoms, being temporarily mobile on surface 12, preferentially seek out and coalesce with other cobalt disilicide molecules at locations 13. At first, locations 13 are random, but soon establish growth centers upon which columns 16 of single crystal cobalt silicide grow. The excess silicon forms a single crystal matrix 14 between and around columns 16. Matrix 14 is depicted as transparent with dashed lines 14 in the drawings to enhance clarity. Both the matrix 14 and the columns 16, once begun, grow generally vertically upward from surface 12 by epitaxial crystal formation. Sometimes, for different substrate crystallographic orientations, the columns grow upward at a non-perpendicular angle.

The height of columns 16 is, in principle, unlimited. The shape and locations of the columns are selectable as well. By raising the substrate temperature or decreasing the rate of deposition, the interval of mobility on surface 12 is lengthened so that columns are produced which are farther apart and have larger diameters. Alternatively, the ratio of silicon to metal may be changed. Less metal results in columns of the same spacing but lesser diameter. Shuttering the cobalt beam stops column growth when desired. New columns can then be initiated by unblocking the cobalt beam. Furthermore, locations 13 may be deliberately chosen and shaped as described in FIGS. 3–11.

Figure 3:
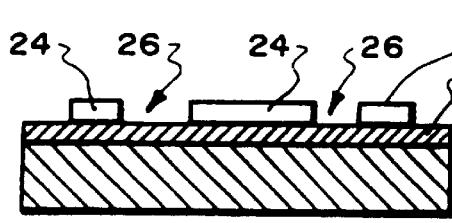
FIGS. 3–5 illustrate the subsequent steps of a first embodiment of the invention for seeding the shape and location of the columns.

In FIG. 3, a fragment of silicon substrate 20 is shown. A planar layer of single crystal cobalt silicide 22 is formed on substrate 20 by conventional MBE methods. A standard photoresist layer 24 is patterned with electron beam lithography and selectively removed, as at 26, by conventional procedures. The exposed parts of the silicide, not protected by resist, are removed by wet or dry etch techniques so as to produce the structure of FIG. 4. Finally, the remaining resist is dissolved away, as in FIG. 5, to leave behind regions 28 of cobalt silicide. Regions 28 have the desired shape and position to serve as nucleation sites upon which columns of cobalt silicide may be grown using the procedures described with respect to FIGS. 1 and 2.

Figure 6:
FIGS. 6–8 illustrate a second method to seed columns.
Figure 4:
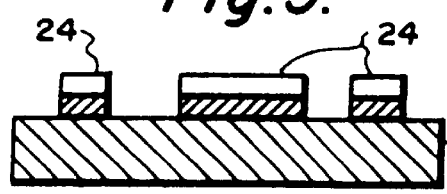
Figure 7:
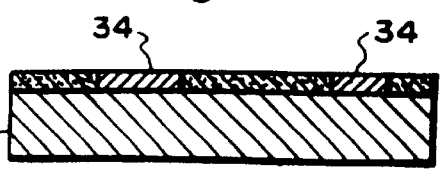
Figure 5:
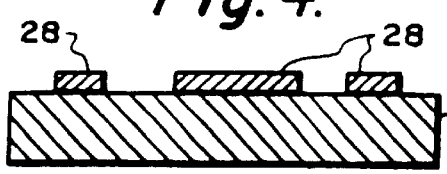
Figure 8:

Another method for initiating column growth in selected locations is shown in FIGS. 6–8. A room temperature substrate 30 receives a stoichiometric deposit of cobalt disilicide. The atoms freeze immediately to the surface to create an amorphous mixture of cobalt and silicon in a layer 32 (FIG. 6). An electron beam is used to write a desired pattern of crystallized regions 34 that epitaxially align with substrate 30 as in FIG. 7. An acid etch step preferentially removes the amorphous material to once again leave behind regions 34 of single crystal silicide upon which vertical structures can nucleate as in FIG. 8.

Figure 9:
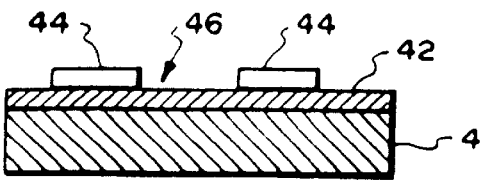
FIGS. 9–11 illustrate a third seed method that creates a planar substrate upon which to grow column structures.
Figure 10:
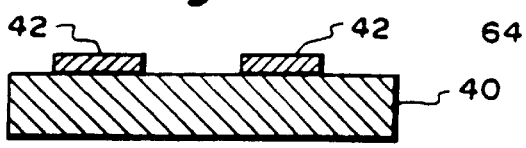
Figure 11:

FIGS. 9–11 show a third and perhaps preferred embodiment of the invention. A layer of pure cobalt (or other metal) 42 is deposited on a substrate 40. Again using well known electron beam lithography techniques, a resist 44 protects selected areas of cobalt layer 42 while exposed areas 46 are removed to produce islands of cobalt 42 as shown in FIG. 10. The FIG. 10 structure is heated to a temperature in the range of 400–600 degrees C. This causes the cobalt to diffuse into the substrate surface to form areas of cobalt disilicide 48 upon which nucleation can be initiated. The advantage of this method is that the final structure, shown in FIG. 11, is planar since the cobalt atoms do not substantially change the physical size of the silicon substrate crystal structure. The planar surface promotes more cleanly defined column structures when the process of FIGS. 1 and 2 is used to grow epitaxial formations thereon.

Even free standing column structures may be produced by plasma etching the matrix embedded columns with $CF_4$ which attacks silicon at a rate about 100 times greater than silicide compounds. Hence, the silicon matrix (14 in FIG. 2) could be removed from about the columns leaving behind free standing structures.

Numerous new electronic devices are made possible by the advent of three dimensional epitaxially grown structures. A few examples are described in FIGS. 12–15.

Figure 12:
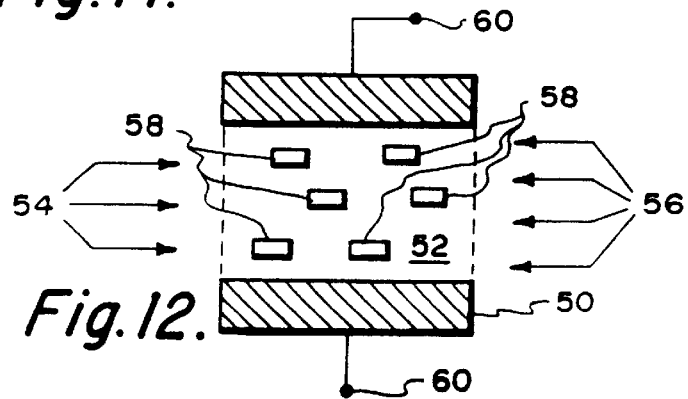
FIG. 12 depicts an example of a three dimensional device that can be made with the instant invention, namely, a photoemission sensor using columns that start and stop in the vertical direction.

Metal silicides are good optical and infrared sensing substances since they produce charge carriers in response to incident photons. The metal layer must be quite thin, however, for these charge carriers to reach the semiconductor and affect the current flow therethrough. Unfortunately, thin layers do not absorb very many photons. Prior art detectors which use planar layers of metal silicide on silicon are limited in sensitivity because of this tradeoff. The instant invention increases this sensitivity by allowing third dimensional expansion of the silicide material for a given cross section of incident photon flux. FIG. 12 shows a substrate 50 upon which a matrix 52 of silicon is grown using MBE methods. Shuttering the cobalt beam on causes layers of growth 54 which include many short columns of silicide 58 suspended in matrix 52. Shuttering the cobalt beam off causes layers of growth 56 with no silicide. The three dimensional cloud of silicide particles is much more likely to intercept a photon in a given cross sectional flux of photons than a single layer as in the prior art. Thus, a layered internal photo-emission sensor may be built in which the current flow between contacts 60 is very sensitive to radiation. Each element of silicide 58 is very thin giving a good internal yield of charge carriers, yet absorption is increased by a massive increase in the area of silicide per unit volume of the sensor.

Figure 13:
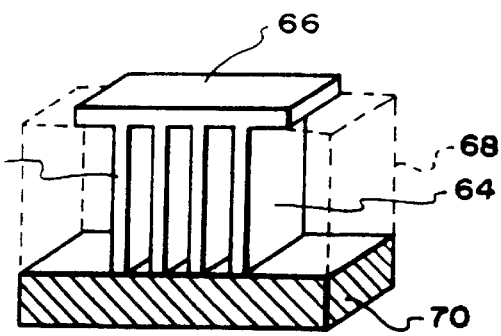
FIG. 13 illustrates how vertical columns may be tied together to create a three dimensional device, in this case, an infrared sensor.

FIG. 13 shows another possibility, where columns 64 of silicide are grown in a matrix 68 deposited on a substrate 70 so as to present increased absorption surface to incident radiation. Columns 64 are joined together at the top by a layer of silicide 66 which can be deposited by conventional techniques.

Figure 14:
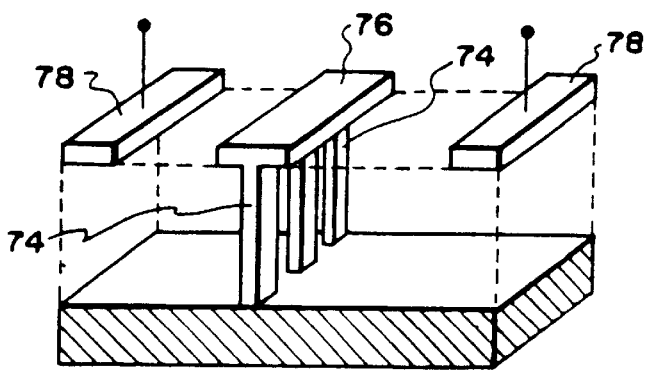
FIG. 14 depicts another possibility, a permeable base transistor.

In FIG. 14, a possible three dimensional permeable base transistor is disclosed wherein metal silicide column conductors 74 connected to a silicide base 76 mediate current flow between emitter and collector contacts 78.

Figure 15:
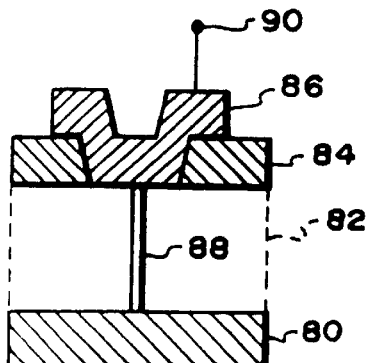
FIG. 15 depicts the development of a column so thin that quantum effects may be studied.

FIG. 15 demonstrates an experimental device with a substrate 80, a matrix 82, a layer of silicon oxide insulator 84, and a metal contact 86. A column of silicide 88 grown up from substrate 80 carries current between contacts 90. With the process of the present invention, columns having diameters of 10 to 250 nanometers have been produced. Both larger and smaller diameters are well within the capabilities of the process. Columns of only a few nanometers in diameter are primarily subject to quantum effects in the carrying of current. Thus, column 88 in FIG. 15 comprises a quantum wire and these quantum effects can be studied.

Three dimensional structures this small are two orders of magnitude smaller than has been possible in the prior art. Clearly, myriad new electronic devices and structures are possible using the principles of the instant invention.

It is to be realized that only preferred embodiments of the invention have been described and that numerous substitutions, modifications and alterations are permissible without departing from the spirit and scope of the invention as defined in the following claims.

What is claimed is:

1. A method of making three dimensional semiconductor devices comprising:

directing a first molecular beam selected from a metal or a first semiconductor-material and a second molecular beam of a second semiconductor material at the surface of a single crystal semiconductor in a vacuum in proportions that include an excess of said second semiconductor material so as to simultaneously form on said surface an epitaxial growth of a single crystal matrix of said second semiconductor material having columns of single crystal of a compound of said metal or said first semiconductor with said second semiconductor material embedded in said matrix.

2. The method of claim 1 in which said substrate is silicon and said molecular beam of second semiconductor material comprises silicon.

3. The method of claim 1 including the step of forming regions of said compound of metal and second semiconductor material on said substrate surface at selected locations so as to establish seed locations upon which said columns nucleate.

4. The method of claim 2 including the step of forming selected nucleation regions of metal silicide on said substrate surface upon which metal silicide columns epitaxially form.

5. The method of claim 4 in which said regions of metal silicide are formed by diffusing patterns of metal formed on said surface into the surface with heat.

6. The method of claim 4 in which said nucleation regions of metal silicide are formed by forming a layer of metal silicide on said surface and then etching a layer of metal silicide on said layer to create a desired pattern of column nucleation sites.

7. The method of claim 4 in which said nucleation regions of metal silicide are formed by electron beam patterning of a layer of amorphous metal and silicon on said surface.

8. The method of claim 1 in which the surface is atomically clean.

9. The method of claim 1 further including the step of heating the surface to a temperature sufficient to allow molecular mobility thereon during said forming step.

10. A process for fabricating conductive structures in a silicon matrix comprising the steps of:

placing a silicon substrate in a molecular beam epitaxy system in high vacuum;

cleaning the surface of the substrate;

heating the substrate to a temperature to support molecular mobility thereon;

evaporating a silicon rich mixture of metal and silicon onto the surface so as to epitaxially grow metal silicide conductors perpendicular to the substrate surface within a matrix of single crystal silicon, said matrix being formed from the excess silicon.

11. The process of claim 10 including the step of periodically interrupting the molecular beam of metal so as to form independent collections of small columns at varying distances from said substrate.

12. The process of claim 10 including the step of forming seed regions of metal silicide on said substrate surface to control the shape and location of said metal silicide conductors.

* * * * *